United States Patent
Numata et al.

(10) Patent No.: US 8,580,031 B2
(45) Date of Patent: Nov. 12, 2013

(54) METHOD OF PRODUCING THREE-DIMENSIONAL PHOTONIC CRYSTAL AND OPTICAL FUNCTIONAL DEVICE

(75) Inventors: Aihiko Numata, Inagi (JP); Hikaru Hoshi, Yokohama (JP); Kenji Tamamori, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 890 days.

(21) Appl. No.: 12/754,833

(22) Filed: Apr. 6, 2010

(65) Prior Publication Data

US 2010/0260228 A1    Oct. 14, 2010

(30) Foreign Application Priority Data

Apr. 8, 2009   (JP) .................... 2009-094041

(51) Int. Cl.
*C30B 29/10*     (2006.01)
(52) U.S. Cl.
USPC ............................ 117/3; 117/4; 117/8; 117/9
(58) Field of Classification Search
USPC ................................................. 117/3, 5, 8, 9
See application file for complete search history.

(56) References Cited

U.S. PATENT DOCUMENTS

| | | | |
|---|---|---|---|
| 5,998,298 A | 12/1999 | Fleming et al. | |
| 6,479,371 B2 | 11/2002 | Noda | |
| 6,650,672 B2 | 11/2003 | Kito et al. | |
| 2006/0081171 A1* | 4/2006 | Enokido | 117/2 |
| 2007/0031108 A1* | 2/2007 | Sugita et al. | 385/147 |
| 2008/0050066 A1* | 2/2008 | Nobayashi et al. | 385/31 |
| 2008/0283487 A1* | 11/2008 | Wang et al. | 216/2 |
| 2010/0303117 A1* | 12/2010 | Ikuta | 372/50.11 |

FOREIGN PATENT DOCUMENTS

| | | |
|---|---|---|
| JP | 2001-281473 A | 10/2001 |
| JP | 3721815 | 11/2005 |
| JP | 3721815 B | 11/2005 |

OTHER PUBLICATIONS

Physical Review Letters, vol. 58, pp. 2059, 1987.

* cited by examiner

*Primary Examiner* — Bob M Kunemund
(74) *Attorney, Agent, or Firm* — Canon U.S.A., Inc., IP Division

(57) ABSTRACT

A method of producing a three-dimensional photonic crystal by laminating a layer having a periodic structure, the method including the steps of forming a first structure and a second structure each including the layer having the periodic structure; and bonding a first bonding layer of the first structure and a second bonding layer of the second structure. The first bonding layer is one layer obtained by dividing a layer constituting the three-dimensional photonic crystal at a cross section perpendicular to a lamination direction, and the second bonding layer is the other layer obtained by dividing the layer constituting the three-dimensional photonic crystal at the cross section perpendicular to the lamination direction.

8 Claims, 9 Drawing Sheets

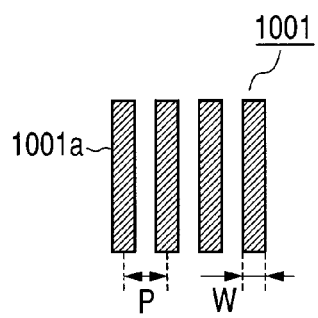
FIG. 2AZ
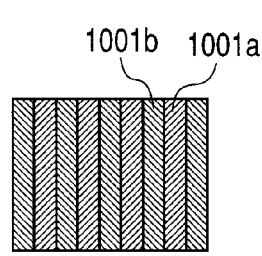
FIG. 2BZ
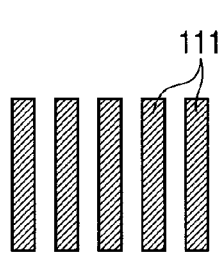
FIG. 2CZ
FIG. 2AX
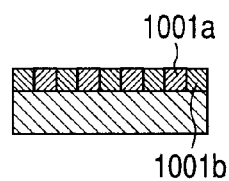
FIG. 2BX
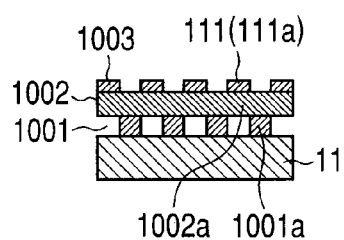
FIG. 2CX
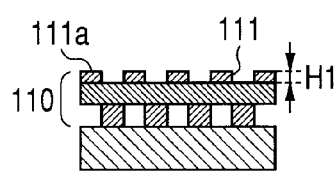
FIG. 2D1
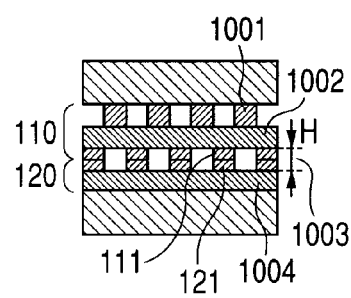
FIG. 2E
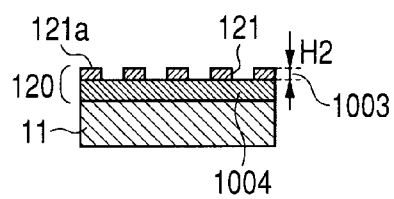
FIG. 2D2
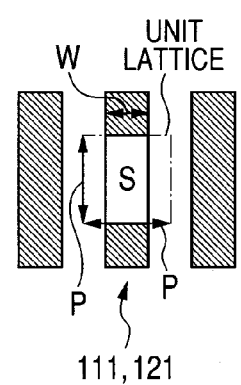
FIG. 2F PRIOR ART
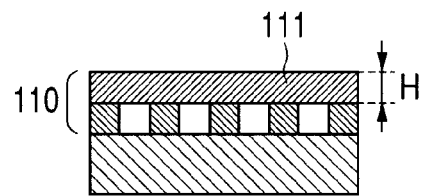
FIG. 3A1
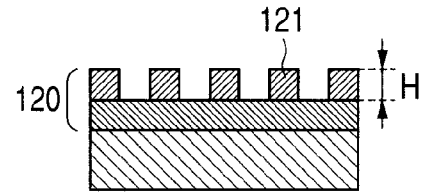
FIG. 3A2
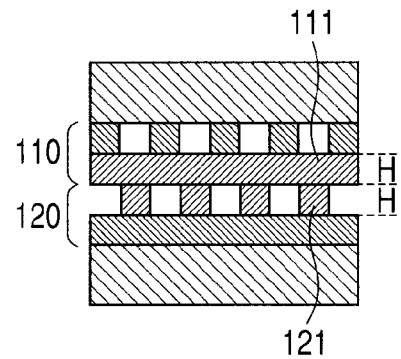
FIG. 3B
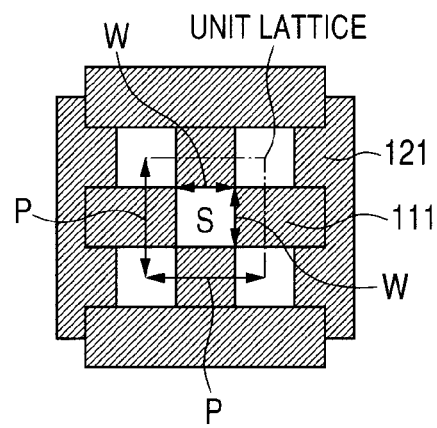
FIG. 3C

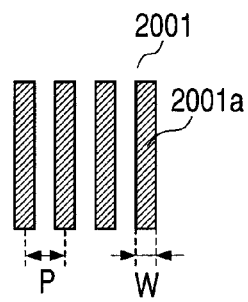
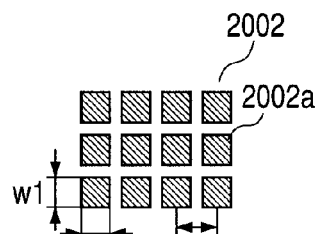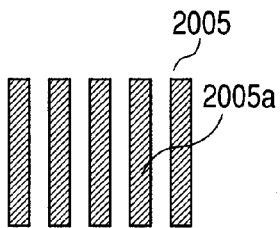
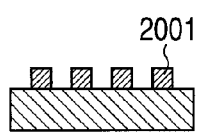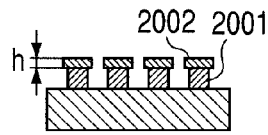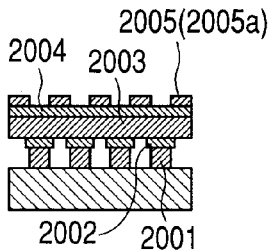
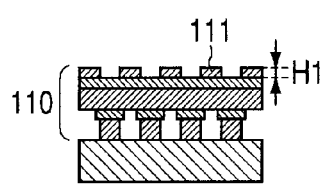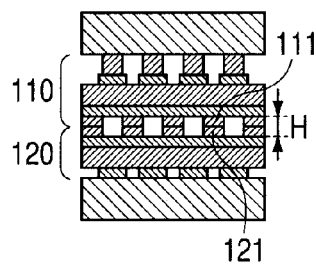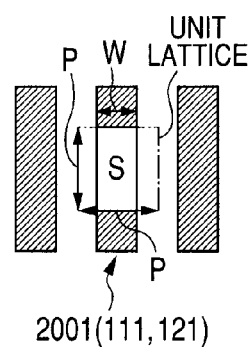
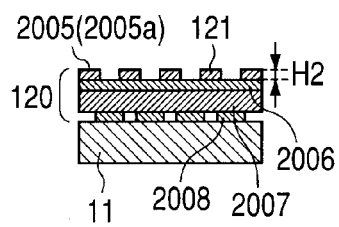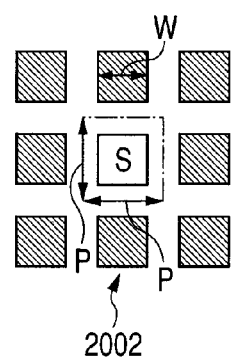

FIG. 6A1
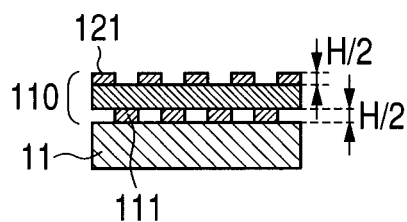
FIG. 6A2
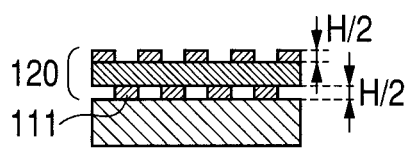
FIG. 6A3
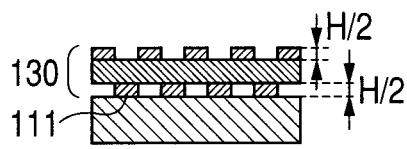
FIG. 6A4
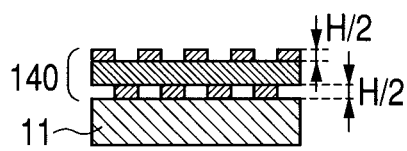
FIG. 6B
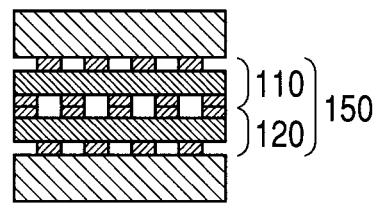
FIG. 6C
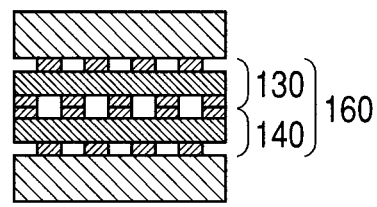
FIG. 6D
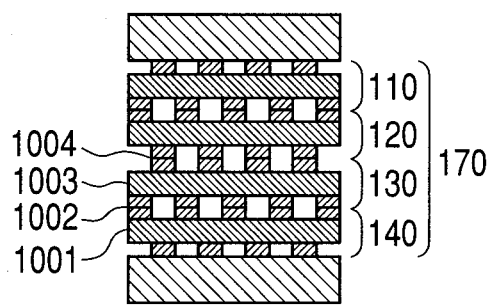

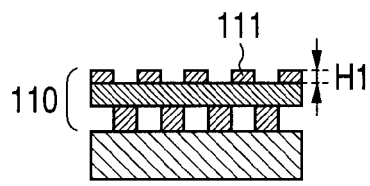
FIG. 8A1
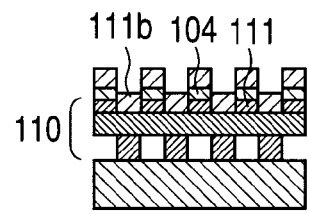
FIG. 8D
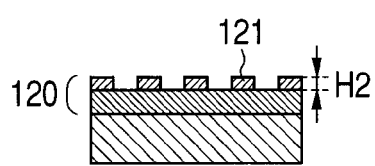
FIG. 8A2
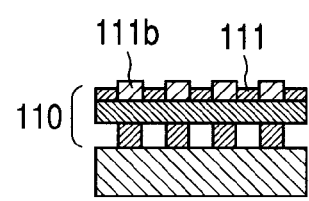
FIG. 8E
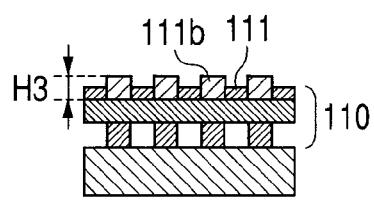
FIG. 8B
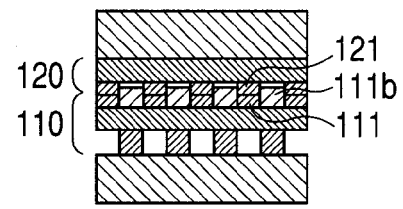
FIG. 8F
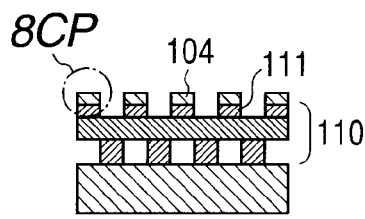
FIG. 8C
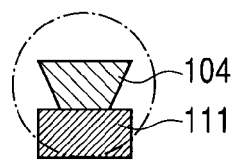
FIG. 8CP

METHOD OF PRODUCING THREE-DIMENSIONAL PHOTONIC CRYSTAL AND OPTICAL FUNCTIONAL DEVICE

BACKGROUND OF THE INVENTION

1. Field of the Invention

The present invention relates to a method of producing a three-dimensional photonic crystal and an optical functional device using the three-dimensional photonic crystal.

2. Description of the Related Art

Yablonovitch has suggested in "Physical Review Letters, Vol. 58, pp. 2059, 1987" that characteristics of electromagnetic waves such as transmission and reflection can be controlled by periodically arranging structures each having a size less than or equal to the wavelength. Such a structure is known as a photonic crystal and can control the propagation of light. In particular, a three-dimensional photonic crystal having a three-dimensional fine periodic structure can three-dimensionally control the propagation of light and thus can be applied to various applications such as a mirror with a reflectivity of 100% independent of the angle of incident light.

A woodpile structure is known as a crystal structure of such a three-dimensional photonic crystal. A structure formed by laminating a plurality of layers each having a periodic structure (layer-by-layer (LBL) structure) like the woodpile structure can be produced by semiconductor process technology (see Japanese Patent Application Laid-Open No. 2001-281473, U.S. Pat. No. 5,998,298, Japanese Patent No. 03721815, U.S. Pat. Nos. 6,650,672, and 6,479,371). Japanese Patent Application Laid-Open No. 2001-281473 and U.S. Pat. No. 5,998,298 propose a method of producing a three-dimensional photonic crystal by sequentially laminating a plurality of layers. In addition, Japanese Patent No. 03721815, U.S. Pat. Nos. 6,650,672 and 6,479,371 propose a method of producing a three-dimensional photonic crystal by bonding a plurality of layers.

SUMMARY OF THE INVENTION

A photonic band gap is caused by a crystal structure whose permittivity changes periodically. Therefore, production of a photonic crystal which exhibits a photonic band gap in a desired wavelength band requires formation of a crystal structure having an accurate period in a three-dimensional direction. Moreover, in order to produce a three-dimensional photonic crystal by laminating a plurality of layers having a periodic structure, the plurality of layers having a periodic structure is required to be strongly bonded together.

Unfortunately, the production methods of Japanese Patent Application Laid-Open No. 2001-281473 and U.S. Pat. No. 5,998,298 includes many steps since layers are laminated layer by layer. Note that the production methods of Japanese Patent No. 03721815, U.S. Pat. Nos. 6,650,672 and 6,479,371 can reduce the number of steps since structures having a plurality of layers are bonded together. However, since the bond strength of a structure is proportional to the bonding area thereof, it is difficult to increase the bond strength by bonding parts of periodic structure different from each other.

An object of the present invention is to produce a three-dimensional photonic crystal having a strong bond strength with fewer production steps, and to provide an optical functional device using the three-dimensional photonic crystal. In an aspect of the present invention, there is provided a method of producing a three-dimensional photonic crystal by laminating a layer having a periodic structure, the method comprising the steps of forming a first structure and a second structure each including the layer having the periodic structure; and bonding a first bonding layer of the first structure and a second bonding layer of the second structure, wherein the first bonding layer is one layer obtained by dividing a layer constituting the three-dimensional photonic crystal at a cross section perpendicular to a lamination direction, and the second bonding layer is the other layer obtained by dividing the layer constituting the three-dimensional photonic crystal at the cross section perpendicular to the lamination direction.

In another aspect of the present invention, there is provided an optical functional device comprising a three-dimensional photonic crystal produced by the above-described method.

In still another aspect of the present invention, there is provided a light emitting device comprising the above-described optical functional device.

The present invention makes it possible to produce a three-dimensional photonic crystal having a strong bond strength with fewer production steps.

Further features of the present invention will become apparent from the following description of exemplary embodiments with reference to the attached drawings.

BRIEF DESCRIPTION OF THE DRAWINGS

FIGS. 2AZ, 2AX, 2BZ, 2BX, 2CZ, 2CX, 2D1, 2D2 2E and 2F are explanatory drawings illustrating a method of producing the three-dimensional photonic crystal of the first embodiment.

FIGS. 3A1, 3A2, 3B and 3C are explanatory drawings illustrating a conventional method of producing a three-dimensional photonic crystal.

FIGS. 5AZ, 5AX, 5BZ, 5BX, 5CZ, 5CX, 5D1, 5D2, 5E, 5F1 and 5F2 are explanatory drawings illustrating a method of producing the three-dimensional photonic crystal of the second embodiment.

FIGS. 6A1, 6A2, 6A3, 6A4, 6B, 6C and 6D are explanatory drawings illustrating a plurality of bonding steps of a third embodiment.

FIGS. 8A1, 8A2, 8B, 8C, 8CP, 8D, 8E and 8F are explanatory drawings illustrating an alignment method of a fourth embodiment.

DESCRIPTION OF THE EMBODIMENTS

Figure 1:
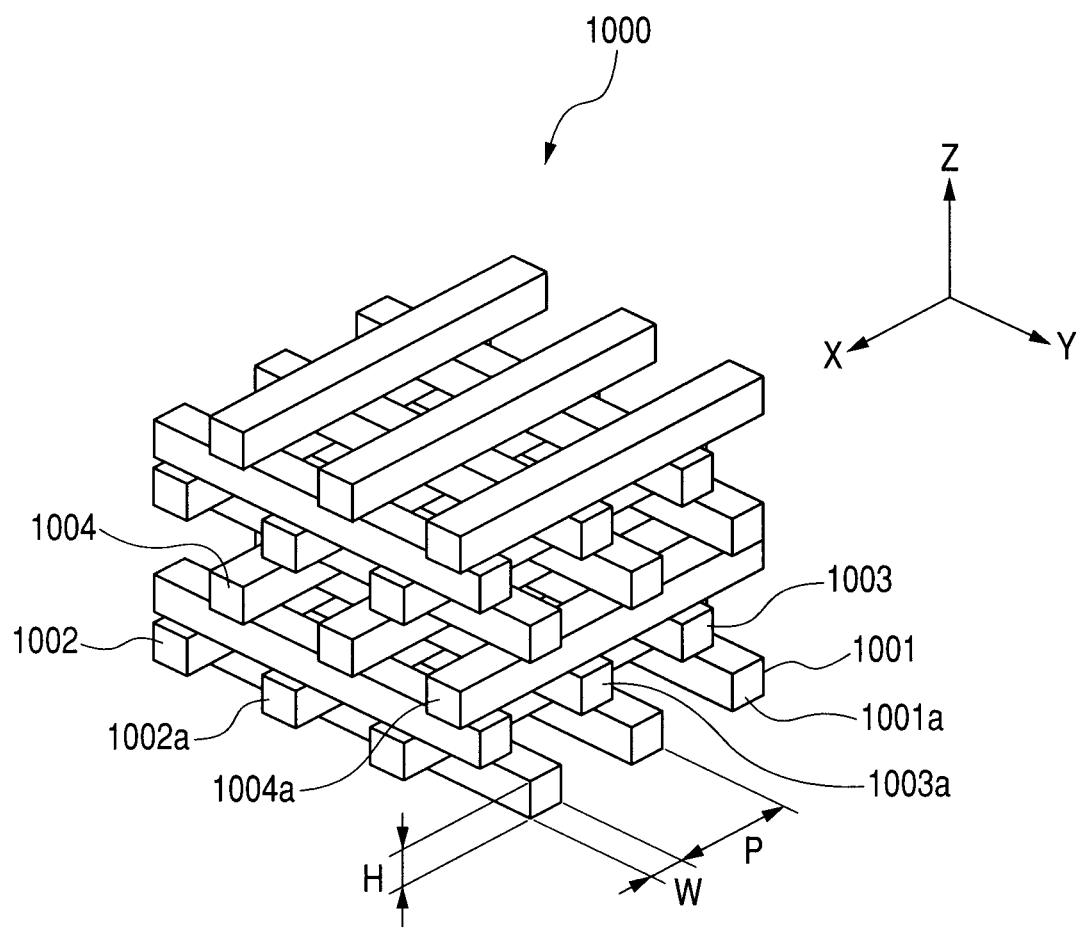
FIG. 1 is an explanatory drawing illustrating a structure of a three-dimensional photonic crystal of a first embodiment.

Preferred embodiments of the present invention will now be described in detail in accordance with the accompanying drawings.

Note that throughout the drawings, like reference numerals or characters refer to like components. The method of producing the three-dimensional photonic crystal of the present invention includes a structure producing step and a bonding step. The structure producing step includes forming a first structure and a second structure each having a layer with a periodic structure. The first structure has a first bonding layer on an outermost surface layer thereof; and the first bonding layer is one layer obtained by dividing a layer of the three-dimensional photonic crystal along the lamination direction.

The outermost surface layer of the first structure has the first bonding layer which is one layer obtained by dividing one layer constituting the three-dimensional photonic crystal at a cross section perpendicular to the lamination direction. The outermost surface layer of the second structure has the second bonding layer which is the other layer obtained by dividing the one layer constituting the three-dimensional photonic crystal at the cross section perpendicular to the lamination direction. In the bonding step, the first bonding layer of the first structure is bonded to the second bonding layer of the second structure. The periodic structure of the first bonding layer matches with the periodic structure of the second bonding layer, and thus the both bonding layers are bonded together such that the respective periodic structures are overlapped to each other in the lamination direction. When the first bonding layer and the second bonding layer are bonded together, one layer of the three-dimensional photonic crystal is formed.

(First Embodiment)

FIG. 1 is a schematic drawing illustrating a three-dimensional photonic crystal 1000 produced by a producing method of a first embodiment. The crystal structure of the three-dimensional photonic crystal 1000 is a woodpile structure. The three-dimensional photonic crystal 1000 has a structure having a fundamental period of four layers: a first layer 1001, a second layer 1002, a third layer 1003 and a fourth layer 1004. The first layer 1001 has a periodic structure in which a plurality of columnar structures (prisms) 1001a with a width W and a height H extending in the Y axis direction are periodically arranged at a lattice constant (pitch) P. The second layer 1002 has the same shape as the columnar structure 1001a and has a periodic structure in which a plurality of columnar structures 1002a extending in the X axis direction are arranged at the pitch P.

The third layer 1003 has the same shape as the columnar structure 1001a and has a periodic structure in which a plurality of columnar structures (prisms) 1003a extending in the Y axis direction are arranged at the pitch P. The third layer 1003 is placed at a position shifted by P/2 in the X axis direction with respect to the columnar structure (prism) 1001a of the first layer 1001. The fourth layer 1004 has the same shape as the columnar structure 1002a and has a periodic structure in which a plurality of columnar structures (prisms) 1004a extending in the X axis direction are arranged at the pitch P. The fourth layer 1004 is placed at a position shifted by P/2 in the Y axis direction with respect to the columnar structure (prism) 1002a of the second layer 1002.

By referring to FIG. 2, the method of producing the three-dimensional photonic crystal 1000 will be described. First, the structure producing step is described. The columnar structure 1001a of the first layer 1001 is formed on a substrate 11 by photolithography or the like (FIG. 2AZ: uppermost layer cross section, and FIG. 2AX: elevational view). The columnar structure 1001a is made of a first medium and forms a periodic structure with the pitch P, the width W and the height H. Then, the portion other than the columnar structure is filled with a sacrifice portion 1001b made of a second medium, and the surface thereof is flattened by chemical mechanical polishing (CMP) or the like (FIG. 2BZ: uppermost layer cross section, and FIG. 2BX: elevational view). Then, each layer is laminated on the first layer 1001 by repeating the steps in FIG. 2A and FIG. 2B, and then the sacrifice portion 1001b is selectively removed by wet etching or the like (FIG. 2CZ: uppermost layer cross section, and FIG. 2CX: elevational view).

As illustrated in FIG. 2C, the first layer 1001, the second layer 1002 and a layer 111 having a periodic structure constituting a part of the third layer 1003 are laminated on the substrate 11. The columnar structure 1001a of the first layer 1001 and the columnar structure 1002a of the second layer 1002 are orthogonal to each other as illustrated in FIG. 1. The columnar structure 1001a of the first layer 1001 is shifted by P/2 in the X direction from the columnar structure 111a constituting a part of the third layer 1003. The materials of the three-dimensional photonic crystal 1000 include semiconductor materials such as GaAs, InP, GaN, and Si, and dielectric materials such as $SiO_2$ and $TiO_2$. The materials of the sacrifice portion 1001b may be any materials as long as the materials allow the columnar structure 1001a to be selectively etched. For example, Cu is used for $TiO_2$ and sulfuric acid may be used as an etchant.

As described above, according to the steps of FIGS. 2A to 2C, a structure 110 (first structure) constituting a part of the woodpile structure is produced by laminating the first layer 1001, the second layer 1002 and a layer 111 having a periodic structure constituting a part of the third layer 1003 (FIG. 2D1). The outermost surface layer of the first structure 110 has one layer 111 obtained by dividing the third layer 1003 which is one layer of the three-dimensional photonic crystal 1000 at a cross section perpendicular to the lamination direction.

Likewise, a structure 120 (second structure) constituting a part of the woodpile structure is produced by laminating the fourth layer 1004 and a layer 121 having a periodic structure constituting a part of the third layer 1003 (FIG. 2D2). The outermost surface layer of the second structure 120 has the other layer 121 obtained by dividing the third layer 1003 which is one layer of the three-dimensional photonic crystal 1000 at the cross section perpendicular to the lamination direction.

Here, the outermost surface layer 111 (first bonding layer) of the structure 110 and the outermost surface layer 121 (second bonding layer) of the structure 120 are produced such that the respective periodic structures are matched with each other. In the case of the woodpile structure, the columnar structures 101a to 104a having the same width W and height H in all layers are arranged at the same lattice constant P. In addition, the sum (H1+H2) of the height H1 of the first bonding layer 111 and the height H2 of the second bonding layer 121 is the same as the height H of the columnar structure of the woodpile structure.

Then, the structure 110 is bonded to the structure 120 such that the layer 111 faces the layer 121 (FIG. 2E) (bonding step). At this time, bonding is performed in such a manner that the periodic structure of the first bonding layer 111 is overlapped to the periodic structure of the second bonding layer 121 in the lamination direction of the woodpile structure. One layer with a height H of the woodpile structure is formed by bonding the first bonding layer 111 with a height H1 to the second bonding layer 121 with a height H2.

According to the present embodiment, the first structure and the second structure each having a plurality of layers are bonded to each other. Therefore, the number of steps can be reduced in comparison with a production method in which layers are laminated one by one. FIGS. 3A to 3C illustrate a conventional production method. In FIG. 3A, the structure 110 (FIG. 3A1) and the structure 120 (FIG. 3A2) are produced such that each of the first bonding layer 111 and the second bonding layer 121 forms one layer of the woodpile structure. Then, the first bonding layer 111 and the second bonding layer 121 are bonded such that the respective columnar structures are orthogonal to each other (FIG. 3B).

The bonding portion of the first bonding layer 111 and the second bonding layer 121 is a cross-over region of the columnar structures each having a width W. Thus, the bonding area (adhesive area) S is the square of W (W×W) (FIG. 3C). Meanwhile, according to the present embodiment, the first bonding layer 111 and the second bonding layer 121 have the same periodic structure and thus the columnar structures 111a and 121a can be bonded entirely (FIG. 2F). The bond strength is proportional to the bonding area S. Thus, the production method of the present embodiment can produce a three-dimensional photonic crystal having a strong bond strength.

Thus, the method of the present embodiment can produce a three-dimensional photonic crystal having a large bond strength with fewer producing steps. Note that according to the present embodiment, a woodpile structure is used as the three-dimensional photonic crystal, but any structure may be produced in the same manner as long as the structure is an LBL structure.

(Second Embodiment)

Figure 4A:
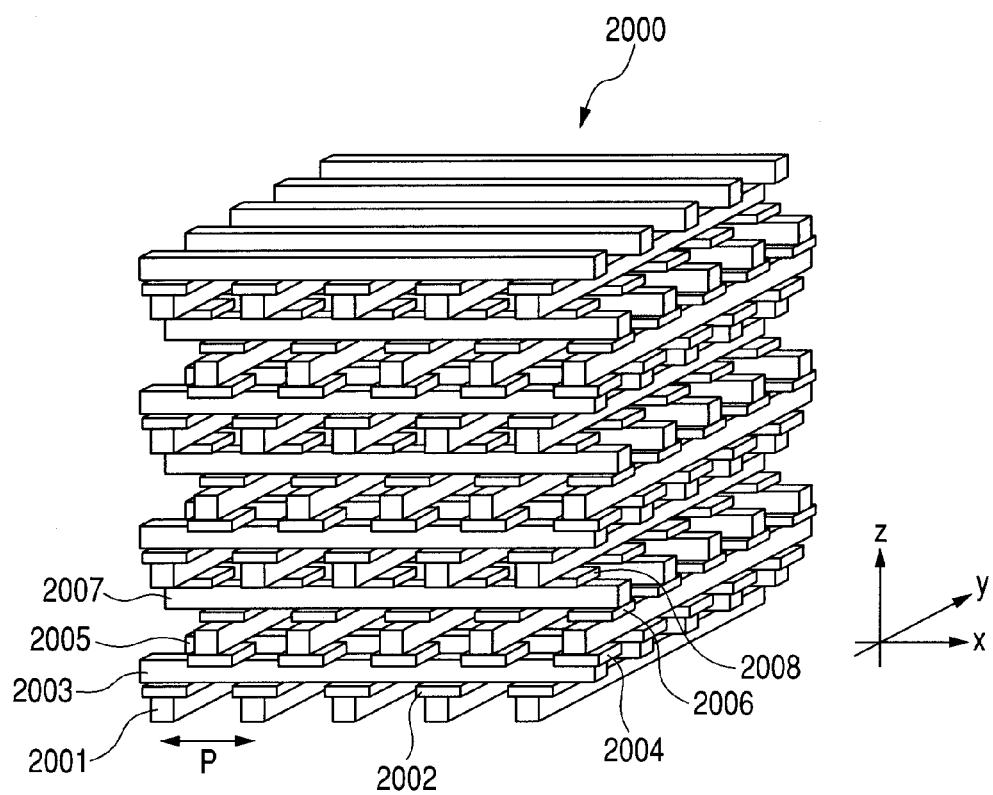
FIGS. 4A and 4B are explanatory drawings illustrating a structure of a three-dimensional photonic crystal of a second embodiment.
Figure 4B:
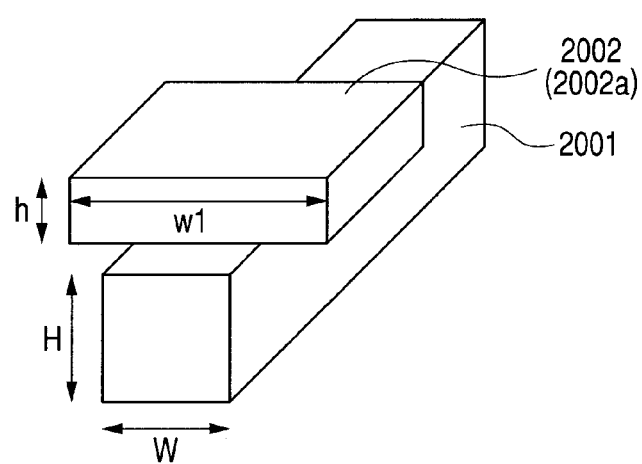
Figure 7A:
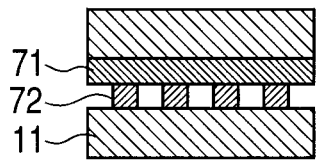
FIGS. 7A, 7B, 7C and 7D are explanatory drawings illustrating a plurality of conventional bonding steps.
Figure 7B:
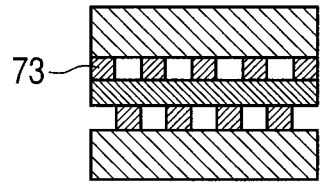
Figure 7C:
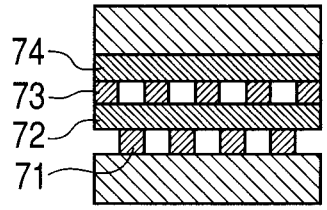
Figure 7D:
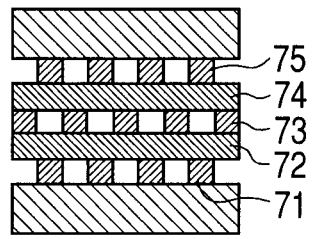

FIG. 4A is a schematic drawing illustrating a three-dimensional photonic crystal 2000 produced by a producing method of a second embodiment of the present invention. The three-dimensional photonic crystal 2000 has such a structure that a square-shaped discrete structure having a length w1 and a height h is arranged at each cross-over point of layered columnar structures of constituting the woodpile structure (FIG. 4B). The first to eighth layers each are indicated by '2001' to '2008' respectively. A first layer 2001, a third layer 2003, a fifth layer 2005 and a seventh layer 2007 are formed of a columnar structure 2001a, a columnar structure 2003a, a columnar structure 2005a and a columnar structure 2007a respectively like the first embodiment.

A second layer 2002, a fourth layer 2004, a sixth layer 2006 and an eighth layer 2008 each are an additional layer arranged such that the second layer 2002 is disposed between the first layer 2001 and the third layer 2003; the fourth layer 2004 is disposed between the third layer 2003 and the fifth layer 2005; the sixth layer 2006 is disposed between the fifth layer 2005 and the seventh layer 2007; and the eighth layer 2008 is disposed between the seventh layer 2007 and another first layer (a first layer of the next periodic structure). The additional layers 2002, 2004, 2006 and 2008 each have discrete structures 2002a, 2004a, 2006a and 2008a respectively at a position corresponding to a cross-over point of columnar structures.

According to the present embodiment, the three-dimensional photonic crystal has two layers 2001 and 2002 each having a different periodic structure as viewed from the lamination direction, but may be made of three or more kinds of periodic structures. FIGS. 5A to 5F are explanatory drawings of the production method of the present embodiment. In the method of producing a three-dimensional photonic crystal 2000 of the present embodiment, the step of forming a structure 110 and a structure 120 by laminating layers is common to that of the first embodiment (FIGS. 5A to 5C). Here, the structure 110 (FIG. 5D1) and the structure 120 (FIG. 5D2) are formed such that both the outermost surface layer 111 (first bonding layer) of the structure 110 and the outermost surface layer 121 (second bonding layer) of the structure 120 have a periodic structure of the fifth layer 2005.

Like the first embodiment, the first bonding layer 111 and the second bonding layer 121 are formed such that the sum of the thicknesses becomes H. The first bonding layer 111 and the second bonding layer 121 are bonded together such that the respective periodic structures are overlapped. Then, a fifth layer 2005 having a columnar structure is formed (FIG. 5E). When the first bonding layer 111 and the second bonding layer 121 are formed by dividing the fifth layer 2005 at a cross section perpendicular to the lamination direction, the bonding area is W×P per unit lattice P×P (FIG. 5F1). When the bonding surface is obtained by dividing the layer 2002, the bonding area is w1×w1 per unit lattice (FIG. 5F2). Therefore, if W×P>w1×w1 where the columnar structure has a width W and the discrete structure has a length w1 and a pitch P, the bonding area can be increased more using the bonding layer obtained by dividing the fifth layer than by dividing the second layer, the fourth layer, the sixth layer or the eighth layer (FIG. 5F).

That is, in order to increase the bond strength, it is preferable that the first bonding layer and the second bonding layer is set to one layer and the other layer respectively obtained by dividing a layer having the largest area of a structure constituting a periodic structure at a cross section perpendicular to the lamination direction of the three-dimensional photonic crystal. According to the present embodiment, a three-dimensional photonic crystal having a strong bond strength can be produced with respect to a three-dimensional photonic crystal having a plurality of periodic patterns. Note that according to the present embodiment, a structure illustrated in FIGS. 4A and 4B is used as the three-dimensional photonic crystal, but likewise another LBL structure having a plurality of periodic patterns may be used to produce a three-dimensional photonic crystal having a strong bond strength.

(Third Embodiment)

FIG. 6 are explanatory drawings of the production method of a third embodiment. According to the third embodiment, when a three-dimensional photonic crystal is produced through a plurality of times of bonding steps, the production is performed using common bonding processes as much as possible. Like the first embodiment, the three-dimensional photonic crystal is a woodpile structure, but another LBL structure may also be used. First, in the same manner as in the first embodiment, four structures 110, 120, 130 and 140 are produced (FIGS. 6A1 to 6A4).

Here, the structures 110, 120, 130 and 140 are produced such that each of the layer 111 just on the substrate 11 and the outermost surface layer 121 has a height of H/2. In addition, the production is performed such that the structure 110 and the structure 130 have the same shape; and the structure 120 and structure 140 have the same shape. Further, like the first embodiment, a structure 150 is produced by bonding the structure 110 and the structure 120; and a structure 160 is produced by bonding the structure 130 and the structure 140 (FIGS. 6B and 6C). Subsequently, the substrates on one end of the structures 150 and 160 are detached by laser lift-off or the like. Then, a structure 170 is produced by bonding the structure 150 and the structure 160 (FIG. 6D). Here, the fundamental period includes four layers: the first layer 1001, the second layer 1002, the third layer 1003 and the fourth layer 1004 (FIG. 6D).

According to the methods disclosed in Japanese Patent Application Laid-Open No. 2001-281473, U.S. Pat. No. 5,998,298 and Japanese Patent No. 03721815, woodpile layers 71 to 75 are bonded layer by layer as illustrated in FIGS. 7A to 7D. Therefore, the process conditions need to be changed for each bonding in FIGS. 7A to 7D. Here, the process conditions include the bonding pressure, temperature and other conditions. In contrast to this, according to the method of the present embodiment, the structure 110 and the structure 130 have the same shape; and the structure 120 and the structure 140 have the same shape. For this reason, the process conditions can be used commonly to the bonding in FIG. 6B and the bonding in FIG. 6C. Thus, the present embodiment can reduce the load required for determining the process conditions when a bonding step is performed a plurality of times. Further, in order to increase the number of layers of the three-dimensional photonic crystal, the steps of bonding a structure having the same shape as the structure 170 produced using the steps FIGS. 6A to 6C again may be repeated.

(Fourth Embodiment)

FIGS. 8A to 8F are explanatory drawings illustrating an alignment method in the bonding steps of the production method of a fourth embodiment. Like the first embodiment, the description is based on a woodpile structure, but can be applied to other LBL structures. First, in the same manner as in the first embodiment, two structures of a structure 110 (first structure) (FIG. 8A1) and a structure 120 (second structure) (FIG. 8A2) are produced. A first bonding layer 111 is made of a first material (medium). The height H1 of the first bonding layer 111 and the height H2 of the second bonding layer 121 are set so as to satisfy H1+H2=H. Subsequently, a sacrifice portion 111b (sacrifice portion) made of a second material is formed in the interspace of the structure 110 (first structure) in the first bonding layer 111. At this time, the height (thickness) H3 of the sacrifice portion 111b is set so as to satisfy H1<H3<H (FIG. 8B).

Specifically, a columnar structure of the first bonding layer 111 is selectively covered with a resist 104 using photolithography or the like (FIG. 8C). Then, the sacrifice portion 111b is deposited at the height H3 using sputtering or the like (FIG. 8D). Subsequently, when the resist 104 is lifted off by etchant, the sacrifice portion 111b can be formed only in the interspace of the structure 110 in the first bonding layer 111 (FIG. 8E).

According to the present embodiment, the sacrifice portion 111b is used for alignment when the structure 110 and the structure 120 are bonded to each other. More specifically, in the bonding step, the first bonding layer 111 and the second bonding layer 121 are bonded to each other by inserting the sacrifice portion of the first bonding layer 111 into the interspace of the structure 120 of the second bonding layer 121. In the step of FIG. 8C, it is preferable to generate undercut (reverse taper) on the resist 104 (FIG. 8CP) to facilitate lifting off in FIG. 8E. The method of generating undercut includes a method in which two layers of resist 104 are formed and a part of the lower layer is selectively removed.

Like the first embodiment, semiconductor materials and dielectric materials are used as the materials of the three-dimensional photonic crystal. For example, when TiO$_2$ is used, Cu may be used as the sacrifice portion 111b, PMMA may be used as the resist 2, and acetone may be used as the etchant. Subsequently, bonding is performed such that the layer 111 of the structure 110 in which the sacrifice portion 111b is formed faces the layer 121 of the structure 120. Since the height H3 of the sacrifice portion 111b is higher than the height H1 of the bonding layer 111, the bonding can be performed such that the columnar structure of the bonding layer 121 is overlapped to the columnar structure of the bonding layer 111 (FIG. 8F).

As described above, according to the present embodiment, in the bonding step, the bonding layer 111 of the structure 110 is bonded to the bonding layer 121 of the structure 120 using the sacrifice portion 111b for alignment. Subsequently, the sacrifice portion 111b is selectively removed. Then, the bonding layer 111 and the bonding layer 121 form one layer of the three-dimensional photonic crystal. Thus, the method of the present embodiment facilitates alignment in the bonding step.

(Fifth Embodiment)

Figure 9A:
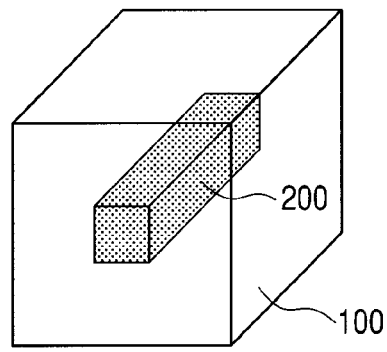
FIGS. 9A, 9B, 9C, and 9D are explanatory drawings illustrating a method of producing an optical functional device and a crystal defect of a fifth embodiment.
Figure 9B:
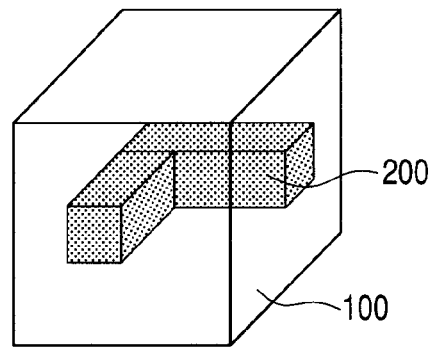

FIGS. 9A to 9D are explanatory drawings of an optical functional device using the three-dimensional photonic crystal. FIG. 9A illustrates an optical functional device in which a waveguide 200 composed of a line-shaped crystal defect is provided in the three-dimensional photonic crystal 100. The optical functional device allows electromagnetic field to be concentrated only on the crystal defect portion. For example, as illustrated in FIG. 9B, a waveguide having a steep bending can be made by making two waveguides 200 orthogonal to each other. As described above, the optical functional device of the present embodiment includes a three-dimensional photonic crystal; the three-dimensional photonic crystal has a line-shaped crystal defect portion; and the crystal defect portion functions as a waveguide.

Figure 9C:
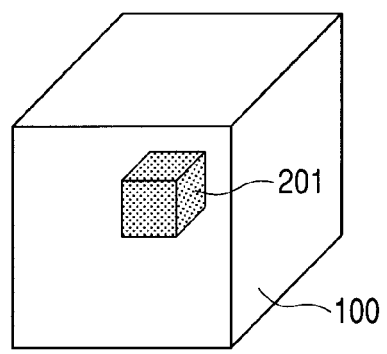
Figure 9D:
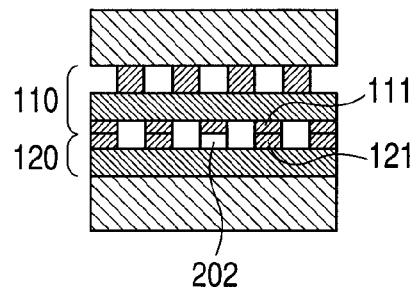

FIG. 9C illustrates an optical functional device in which a resonator 201 composed of a dot-shaped crystal defect is provided in the three-dimensional photonic crystal 100. The optical functional device allows electromagnetic field to be concentrated only on the crystal defect portion 201. Thus, a filter excellent in wavelength selection can be made. The optical functional device of the present embodiment includes a three-dimensional photonic crystal; the three-dimensional photonic crystal has an isolated crystal defect portion; and the crystal defect portion functions as a resonator. The line-shaped defect 200 and the dot-shaped defect 201 may be made by removing a part of the structure 110 and the structure 120 or adding a new structure. In particular, when a crystal defect 202 is provided in a part of the first bonding layer 111 and the second bonding layer 121 as illustrated in FIG. 9D, a crystal defect thinner than a layer of an LBL structure can be provided. Thus, the design freedom for the crystal defect increases compared with that produced by a conventional method. For example, the thinner the crystal defect is, the easier it is to design the resonator and the waveguide in a single mode.

(Sixth Embodiment)

A current injection type optical functional device using a three-dimensional photonic crystal will be described. The three-dimensional photonic crystal uses a woodpile structure, but another LBL structure may be used likewise. When an optical functional device operating by current injection is to be produced, there is a problem of carrier loss at a bonding surface of each layer of the three-dimensional photonic crystal.

According to the production method of the present invention, the first bonding layer 111 and the second bonding layer 121 are bonded to each other such that the respective periodic structures are overlapped to each other. Therefore, no dangling bond occurs and non-emission recombination can be reduced in comparison with a conventional method. In addition, the electrical resistance is proportional to the cross-sectional area of the current path. Thus, a resistance value in a portion having a small cross-sectional area becomes dominant. When bonding is performed conventionally such that the columnar structures are orthogonal to each other, the bonding area is relatively small and thus the resistance value becomes large as well as the resistance value is further increased due to contact failure on the bonding surface.

According to the present invention, the first bonding layer 111 and the second bonding layer 121 are bonded to each other such that the respective periodic structures are overlapped to each other, and thus the resistance value can be easily suppressed in comparison with a conventional method. In addition, the resistance value can be reduced by appropriately arranging a conductive material at least in a part of the first bonding layer 111 and the second bonding layer 121.

Figure 10A:
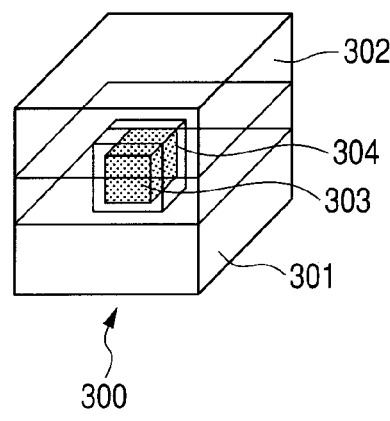
FIGS. 10A and 10B are explanatory drawings illustrating a current injection type optical functional device of a sixth embodiment.
Figure 10B:
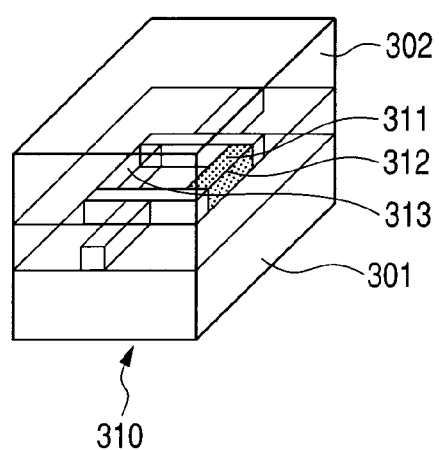

FIGS. 10A and 10B each are a schematic drawing illustrating a current injection optical functional device applicable to the present embodiment. FIG. 10A is an explanatory drawing illustrating a light emitting device 300 where the three-dimensional photonic crystal includes a P clad 301, an N clad 302 and an active portion 303. Positive holes are injected from the p-type semiconductor to the active portion; electrons are injected from the n-type semiconductor to the active portion; and then the electrons and the positive holes are recombined to emit light. As illustrated in FIG. 10A, a resonator 304 formed by a crystal defect is provided in the light emitting device 300; an active portion (active medium) 303 exhibiting light emission is provided in the resonator 304 (inside the resonator); and when the active portion 303 is excited by an excitation unit, highly efficient light emission can be obtained in the inside of the active portion 303. Note that a configuration of providing a crystal defect is not necessarily needed.

FIG. 10B is an explanatory drawing illustrating a light modulation device 310 where the three-dimensional photonic crystal includes a P clad 301, an N clad 302 and an optical modulation region 311 sandwiched between the p-type semiconductor and the n-type semiconductor. Branch waveguides 312 and 313 are provided inside the optical modulation device 310. The phase difference in light propagating through the branch waveguide 312 and the branch waveguide 313 can be controlled by injecting current into the optical modulation region 311. The intensity of output light can be modulated by the phase difference between the branch waveguide 312 and the branch waveguide 313.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-094041, filed Apr. 8, 2009, which is hereby incorporated by reference herein in its entirety.

What is claimed is:

1. A method of producing a three-dimensional photonic crystal by laminating a layer having a periodic structure, the method comprising the steps of:

forming a first structure and a second structure each including the layer having the periodic structure; and bonding a first bonding layer of the first structure and a second bonding layer of the second structure, wherein the first bonding layer is one layer obtained by dividing a layer constituting the three-dimensional photonic crystal at a cross section perpendicular to a lamination direction, and the second bonding layer is the other layer obtained by dividing the layer constituting the three-dimensional photonic crystal at the cross section perpendicular to the lamination direction.

2. The method of producing a three-dimensional photonic crystal according to claim 1, wherein the first bonding layer and the second bonding layer are one layer and the other layer respectively obtained by dividing a layer with the largest area of a structure constituting the periodic structure at the cross section perpendicular to the lamination direction of the three-dimensional photonic crystal.

3. The method of producing a three-dimensional photonic crystal according to claim 1, further comprising the step of forming a sacrifice portion in an interspace of a structure of one of the bonding layers, the sacrifice portion being thicker than the structure of the one of the bonding layers, wherein in the bonding step the one of the bonding layers and the other of the bonding layers are bonded by inserting the sacrifice portion of the one of the bonding layers into an interspace of a structure of the other of the bonding layers.

4. The method of producing a three-dimensional photonic crystal according to claim 1, further comprising the step of forming a crystal defect in at least one of the first bonding layer and the second bonding layer.

5. The method of producing a three-dimensional photonic crystal according to claim 1, wherein at least a part of the first bonding layer and the second bonding layer is formed of a conductive material.

6. An optical functional device comprising a three-dimensional photonic crystal produced by the method according to claim 1, wherein the three-dimensional photonic crystal has a line-shaped crystal defect portion, and the crystal defect portion functions as a waveguide.

7. An optical functional device comprising a three-dimensional photonic crystal produced by the method according to claim 1, wherein the three-dimensional photonic crystal has an isolated crystal defect portion, and the crystal defect portion functions as a resonator.

8. A light emitting device comprising the optical functional device according to claim 7, the resonator of the optical functional device including an active medium in the inside thereof; and an excitation unit for exciting the active medium.

* * * * *